(12) United States Patent
Shichijo et al.

(10) Patent No.: US 9,722,156 B2
(45) Date of Patent: Aug. 1, 2017

(54) LIGHT-EMITTING DEVICE

(71) Applicant: NICHIA CORPORATION, Anan-shi, Tokushima (JP)

(72) Inventors: Satoshi Shichijo, Tokushima (JP); Kunihito Sugimoto, Anan (JP); Kenji Ozeki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/239,914

(22) Filed: Aug. 18, 2016

(65) Prior Publication Data
US 2017/0054064 A1 Feb. 23, 2017

(30) Foreign Application Priority Data

Aug. 18, 2015 (JP) ................. 2015-160794

(51) Int. Cl.
H01L 33/50 (2010.01)
H01L 33/60 (2010.01)
H01L 33/54 (2010.01)
H01L 33/56 (2010.01)
H01L 33/58 (2010.01)

(52) U.S. Cl.
CPC ............. H01L 33/60 (2013.01); H01L 33/50 (2013.01); H01L 33/502 (2013.01); H01L 33/54 (2013.01); H01L 33/56 (2013.01); H01L 33/58 (2013.01); H01L 33/505 (2013.01)

(58) Field of Classification Search
CPC ... H01L 25/0753; H01L 33/50; H01L 33/504; H01L 33/505; H01L 33/58; H01L 33/60; H01L 33/502; H01L 33/54
See application file for complete search history.

(56) References Cited

U.S. PATENT DOCUMENTS

| 2008/0185603 A1* | 8/2008 | Itoi ................... A61B 1/05 257/98 |
| 2010/0264438 A1* | 10/2010 | Suenaga ............ H01L 33/58 257/98 |
| 2013/0056781 A1 | 3/2013 | Suenaga |
| 2013/0188381 A1* | 7/2013 | Kotani .............. H01L 33/54 362/517 |

(Continued)

FOREIGN PATENT DOCUMENTS

| JP | 2010-219324 A | 9/2010 |
| JP | 2010-272847 A | 12/2010 |

(Continued)

Primary Examiner — Marvin Payen
Assistant Examiner — Jeremy Joy
(74) Attorney, Agent, or Firm — Global IP Counselors, LLP

(57) ABSTRACT

A light-emitting device includes a light-emitting element; a first light transmissive member that is disposed over the light-emitting element and that includes a first upper surface, a lower surface, a first lateral surface; and a second lateral surface positioned outside the first lateral surface, a second light transmissive member that covers at least a part of the first lateral surface; and a light reflective member that is disposed on a lateral surface of the second light transmissive member, the second lateral surface of the first light transmissive member, and a lateral surface of the light-emitting element.

21 Claims, 2 Drawing Sheets

(56) References Cited

U.S. PATENT DOCUMENTS

| | | |
|---|---|---|
| 2013/0313602 A1 | 11/2013 | Suenaga |
| 2014/0103798 A1* | 4/2014 | Yamanaka ............. H05B 33/04 |
| | | 313/512 |
| 2015/0102366 A1 | 4/2015 | Wada |
| 2015/0188004 A1* | 7/2015 | Ozeki ................... H01L 33/507 |
| | | 257/98 |
| 2016/0079486 A1 | 3/2016 | Sugimoto et al. |

FOREIGN PATENT DOCUMENTS

| | | |
|---|---|---|
| JP | 2012-079840 A | 4/2012 |
| JP | 2013-149906 A | 8/2013 |
| JP | 2013-179132 A | 9/2013 |
| JP | 2015-079805 A | 4/2015 |
| WO | 2014-171277 A1 | 10/2014 |

* cited by examiner

LIGHT-EMITTING DEVICE

CROSS-REFERENCE TO RELATED APPLICATION

This application claims priority to Japanese Patent Application No. 2015-160794, filed on Aug. 18, 2015, the disclosure of which is hereby incorporated by reference in its entirety.

BACKGROUND OF THE INVENTION

1. Technical Field

The present invention relates to a light-emitting device.

2. Description of Related Art

In recent years, semiconductor light-emitting elements have been utilized not only for light sources for lighting in place of fluorescent lumps but also for light sources having good directivity and high luminance, including floodlights such as the headlights of a vehicle and floodlighting. Light-emitting devices used for the aforementioned purposes have been known (for example, Japanese Unexamined Patent Application Publication No. 2010-272847). In the light-emitting device, light-emitting elements are covered, and the peripheral lateral surface of a light transmissive member to be joined is regarded as an inclined surface expanded to a lower surface, and a portion, which is not joined with the light-emitting elements and the inclined surface on the lower surface, are covered with light reflective resin, in order to achieve high luminance.

SUMMARY OF THE INVENTION

A light-emitting device according to an embodiment of the present disclosure may include a light-emitting element, a first light transmissive member disposed over the light-emitting element and including a first upper surface, a lower surface, a first lateral surface, and a second lateral surface positioned outside the first lateral surface, a second light transmissive member covering at least a part of the first lateral surface, and a light reflective member disposed on the second light transmissive member, the second lateral surface of the first light transmissive member, and a lateral surface of the light-emitting element.

DETAILED DESCRIPTION OF EMBODIMENTS

In the present application, there is a case where magnitudes or positional relations of members illustrated in each drawing are exaggerated so as to clarify the descriptions. In the descriptions below, the same term or reference number represents the same or homogenous member, and therefore its detailed descriptions are appropriately omitted. The content described in one example or one embodiment can be applied to another example or another embodiment.

Figure 1A:
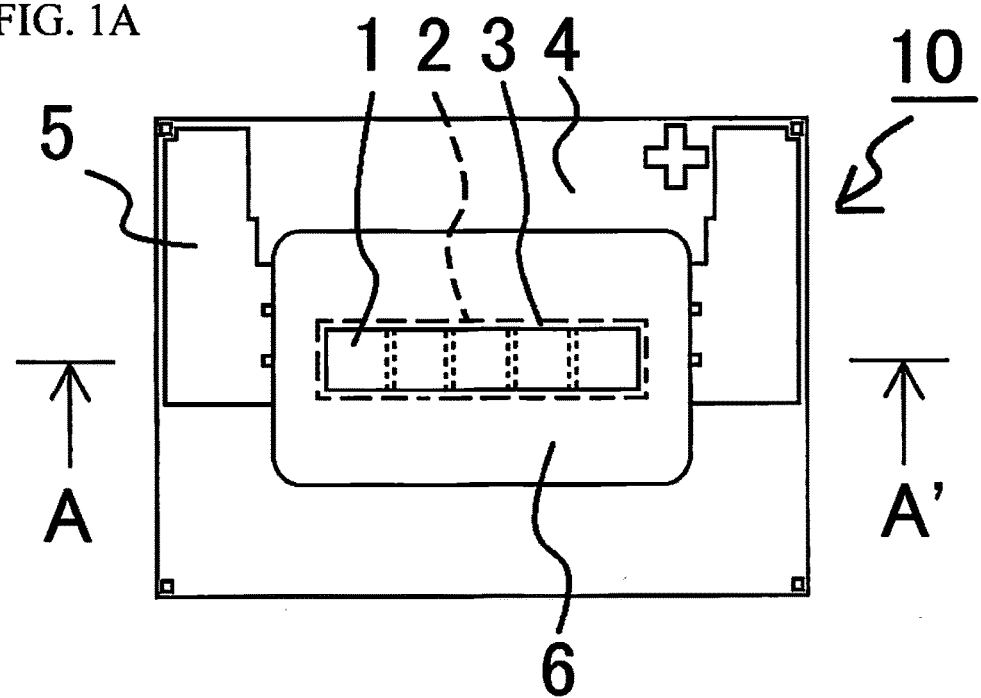
FIG. 1A is a schematic plan view illustrating a light-emitting device of an embodiment of the present invention.
Figure 1B:
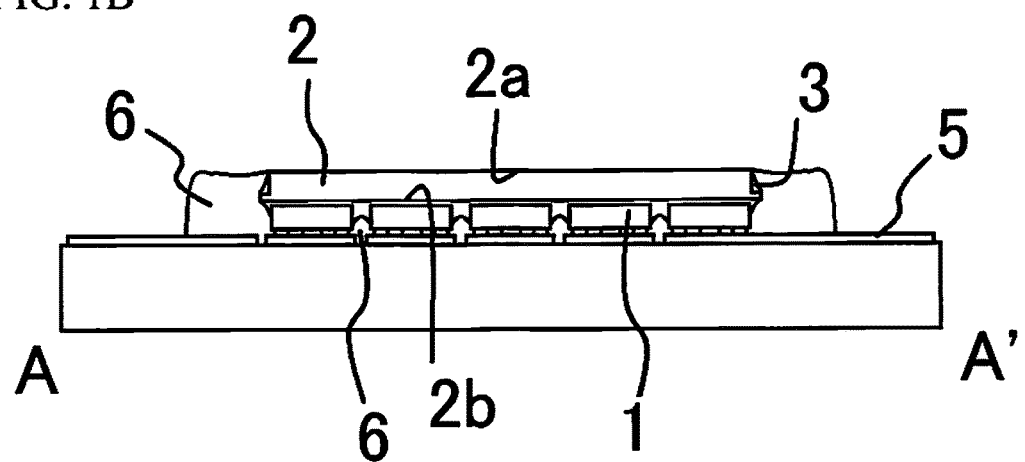
FIG. 1B is a schematic cross-sectional view taken along line A-A' in FIG. 1A.

As illustrated in FIGS. 1A and 1B, a light-emitting device 10 of the present embodiment includes a light-emitting element 1, a first light transmissive member 2, a second light transmissive member 3, and a light reflective member 6. The first light transmissive member 2 is arranged on the light-emitting element 1 and includes a first upper surface 2a, a lower surface 2b, a first lateral surface 2c, and a second lateral surface 2d positioned on the outside with respect to the first lateral surface 2c. The second light transmissive member 3 covers at least part of the first lateral surface 2c of the first light transmissive member 2. The light reflective member 6 is arranged on the second light transmissive member 3, the second lateral surface 2d of the first light transmissive member 2, and a lateral surface of the light-emitting element 1.

(First Light Transmissive Member 2)

Figure 2A:
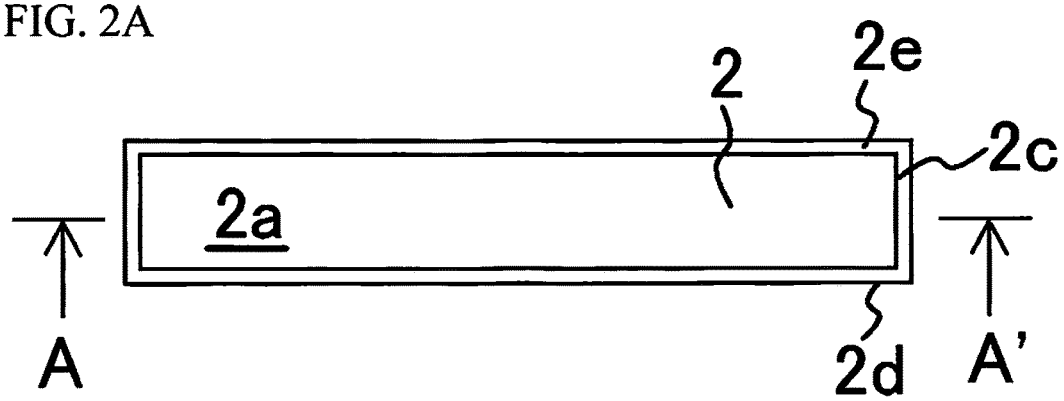
FIG. 2A is a schematic plan view illustrating a first light transmissive member used for the light-emitting device of the embodiment of the present invention.
Figure 2B:
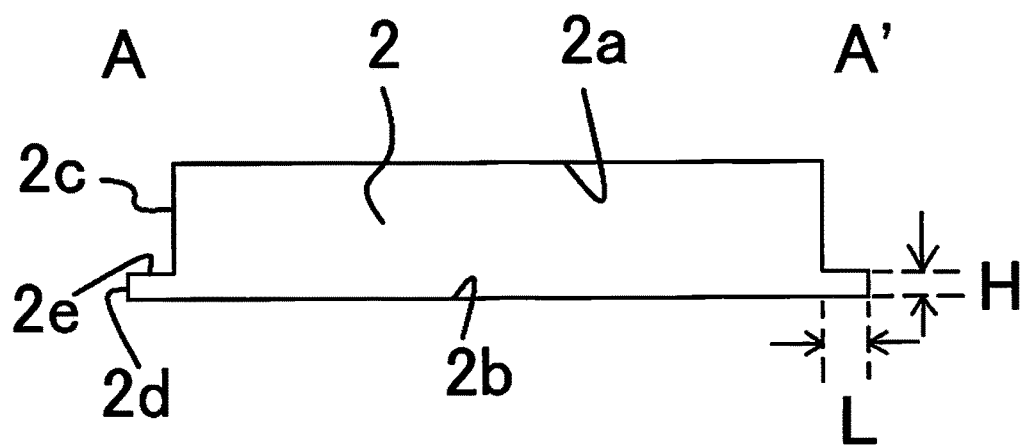
FIG. 2B is a schematic cross-sectional view taken along line A-A' in FIG. 2A.

The first light transmissive member 2 is a member that covers a light extraction surface of the light-emitting element 1, allows the light emitted from the light-emitting element 1 to pass through, and discharges the light to the outside. As illustrated in FIGS. 2A and 2B, the first light transmissive member 2 includes the first upper surface 2a, the lower surface 2b, the first lateral surface 2c, and the second lateral surface 2d positioned on the outside with respect to the first lateral surface 2c.

It is preferable that the first upper surface 2a, and the lower surface 2b of the first light transmissive member 2 be flat surfaces and parallel to each other. In the Description, being parallel means that the inclination of one surface with respect to the other surface is in the range of plus or minus approximately 5 degrees. With this shape, the light-emitting device 10, whose frontal luminance is uniform, can be provided, which leads to less color non-uniformity in terms of light emission, on the first upper surface 2a of the first light transmissive member 2, which serves as a light emission surface. The thickness of the first light transmissive member 2 is not particularly limited, and for example, may range approximately in a range of 50 μm to 300 μm. The first upper surface 2a of the first light transmissive member 2 may be formed in a concave and convex shape, a curved surface shape, or a lens shape.

It is preferable that the first lateral surface 2c of the first light transmissive member 2 be arranged above the second lateral surface 2d. In other words, it is preferable that the first lateral surface 2c be arranged on a far side from the light-emitting element 1 with respect to the second lateral surface 2d. Furthermore, saying it differently, it is preferable that an area of upper side of the first light transmissive member 2 be smaller than an area of lower side of the first light transmissive member 2. The first light transmissive member 2 having the aforementioned structure is arranged on the light-emitting element, so that in the case where the first upper surface 2a serves as the light emission surface of the light-emitting device 10, the light-emitting device 10, whose frontal luminance is high, and whose light emission surface is reduced, can be provided.

It is preferable that the first lateral surface 2c and the second lateral surface 2d be flat surfaces and parallel to each other. That is, it is preferable that the first lateral surface 2c and the second lateral surface 2d not be inclined or curved without depressions and projections but be flat. Also, it is preferable that the first lateral surface 2c and the second lateral surface 2d be respectively perpendicular surfaces to the first upper surface 2a and the lower surface 2b. In particular, it is preferable that the first lateral surface 2c is in contact with the first upper surface 2a and be the perpendicular surface to the first upper surface 2a. The first lateral surface 2c is in contact with the first upper surface 2a and is the perpendicular surface with respect to the first upper surface 2a, so that in the case where the first upper surface 2a serves as a light extraction surface of the light-emitting device, the light-emitting device 10, in which a difference in luminance between the light-emitting portion (i.e., the first upper surface 2a of the first light transmissive member) and a non-light-emitting portion (i.e., on the light reflective member 6 in the periphery of the first light transmissive member 2 described later) is clear, and non-uniformity of light emission color is reduced, can be achieved. Also, it is preferable that the second lateral surface 2d be in contact with the lower surface 2b and be the perpendicular surface to the lower surface 2b. The second lateral surface 2d is in contact with the lower surface 2b and is the perpendicular surface to the lower surface 2b, so that in the case where an adhesive material is used to join the light-emitting element 1 with the first light transmissive member 2, the adhesive material can be prevented from leaking and spreading over the second lateral surface.

The second lateral surface 2d may be positioned on the outside with respect to the first lateral surface 2c in a stepwise manner, but it is preferable that the second lateral surface 2d be positioned on the outside with a difference in level. Accordingly, it is preferable that the first light transmissive member 2 include a second upper surface 2e between the first lateral surface 2c and the second lateral surface 2d. The second upper surface 2e may be inclined to the first upper surface 2a and/or the lower surface 2b, but it is preferable that the second upper surface 2e include a surface parallel to the first upper surface 2a and/or the lower surface 2b. Accordingly, in the case where the light reflective member 6 described later is arranged on the second upper surface 2e, the thickness of the light reflective member 6 is made uniform. Consequently, the light-emitting device, in which a difference in luminance between the light-emitting portion (i.e., the first upper surface 2a of the first light transmissive member 2) and the non-light-emitting portion (i.e., on the light reflective member 6 in the periphery of the first upper surface 2a) is clear, and non-uniformity of light emission color, can be achieved. The second upper surface 2e is arranged along the periphery of the first light transmissive member 2, and the width of the second upper surface 2e may be varied on part of the periphery. However, it is preferable that the width of the second upper surface 2e be uniform on the entire periphery, considering that the light from the light-emitting element 1 is uniformly reflected on the periphery.

A distance L (see FIG. 2B) between the first lateral surface 2c and the second lateral surface 2d is exemplified, for example, by approximately in a range of 10 μm to 300 μm. As described later, in the case where slight displacement occurs during the process that the light-emitting element 1 is covered with the first light transmissive member 2, the entire upper surface of the light-emitting element 1 can be covered with the lower surface 2b of the first light transmissive member 2 in ratio to an increase of the distance L. However, in the case where the distance L is too large, a proportion of covering surfaces except for the first upper surface 2a of the light-emitting element 1 is increased, which may lead to the cause of non-uniformity of light emission color.

It is preferable that a height H (see FIG. 2B) from the lower surface 2b to the first lateral surface 2c of the first light transmissive member 2 be, for example, approximately 10 to 35 percent of the thickness (the height from the first upper surface 2a to the lower surface 2b of the first light transmissive member 2) of the first light transmissive member 2, more preferably 20 to 30 percent of the thickness. The larger the value of the height H becomes, the less the volume of the light reflective member 6 arranged above the second upper surface 2e will be, which causes the risk that the light leaks through the light reflective member 6 in the periphery of the first upper surface 2a. Also, the smaller the value of the height H becomes, the more likely the chipping occurs, which is hard for the light from the light-emitting element 1 to travel in the first upper surface 2a.

The first upper surface 2a is a surface from which the light from the light-emitting element 1 is emitted to the outside, as a light emission surface of the light-emitting device 10, and the lower surface 2b is a surface for covering the light extraction surface of the light-emitting element 1. Normally, it is necessary to cover the entire light extraction surface of the light-emitting element 1 with the first light transmissive member so as to extract the whole of light emitted from the light-emitting element 1. On the other hand, it has been verified that the luminance of light extracted from the light extraction surface is reduced as the size of the first light transmissive member becomes larger with respect to the light extraction surface. Accordingly, it is preferable that the area of the lower surface 2b of the first light transmissive member 2, which covers the light-emitting element 1, be equal to or larger than that of the light extraction surface of the light-emitting element 1, more preferably, be equal to that of the light extraction surface as much as possible. That is, it is preferable that the edge of the first upper surface 2a of the first light transmissive member 2 correspond to the outer edge of the light-emitting element 1 in a plan view, or be positioned on the inner side with respect to the outer edge. Accordingly, the light emitted from the light-emitting element 1 can be securely taken out to the outside, thereby obtaining higher luminance, in addition to the achievement of further down-sizing of the light-emitting device 10.

The shape of the first light transmissive member 2 in a plan view can be appropriately set based on the shape, the number, or arrangement of the light-emitting elements 1, which is described later, and exemplified by a circle, an ellipse, a polygon or shapes approximate thereof. Among them, normally, it is preferable that the shape of the first light transmissive member 2 be formed in a quadrangle in accordance with the outer edge shape of the light-emitting element 1. It is preferable that the first upper surface 2a and the lower surface 2b of the first light transmissive member 2 be similar in shape.

In the case where a plurality of light-emitting elements 1 are covered with one first light transmissive member 2, it is preferable that the first light transmissive member 2 cover the entire light extraction surfaces of the plurality of light-emitting elements 1. In this case, it is preferable that, in a plan view, the edge of the first upper surface 2a of the first light transmissive member 2 approximately correspond to the outer edge of a group of the plurality of light-emitting elements 1 arranged on the mounting board, or be positioned on the inner side with respect to the outer edge of the group of the plurality of light-emitting elements 1.

The area of the lower surface 2b of the first light transmissive member 2 is larger than the area of the upper surface of the light-emitting element 1. Accordingly, the entire light emission surface of the light-emitting element 1 can be covered with the first light transmissive member 2, so that loss of light can be reduced. In the case where the first light transmissive member 2 is arranged above the light-emitting element 1, and even in the case where the positions are slightly shifted, the entire upper surface of the light-emitting element 1 can be covered with the lower surface 2b of the first light transmissive member 2, which hardly leads to change in luminance due to positional displacement. As a result, the yields in manufacturing the light-emitting device 10 can be improved. As described later, in the case where the adhesive material is used to join the light-emitting element 1 with the first light transmissive member 2, size of the first light transmissive member 2 can be made larger than the light-emitting element 1, thereby preventing the adhesive material from leaking to or creeping up the lateral surface of the first light transmissive member 2 during the joining.

Herein, in the case where the lower surface 2b of the first light transmissive member 2 and the upper surface of the light-emitting element 1 are flat surfaces, the aforementioned areas mean the areas of the flat surfaces, and in the case where the lower surface 2b of the first light transmissive member 2 and the upper surface of the light-emitting element 1 are not flat surfaces, the aforementioned areas mean the areas in the outer edges of the lower surface 2b of the first light transmissive member 2 and the upper surface of the light-emitting element 1 in a plan view. It is preferable that a ratio of the area of the lower surface 2b of the first light transmissive member 2 to the area of the upper surface of the light-emitting element 1 be, for example, approximately 10:8 to 10, more preferably, approximately 10:9 to 10, further preferably, approximately 10:9.5. It is preferable that the area of the upper surface 2a of the first light transmissive member 2 be equal to the area of the upper surface of the light-emitting element 1. Herein, being equal means that a difference of plus or minus approximately 10 percent is allowable.

In the case where the first light transmissive member 2 includes the first lateral surface 2c and the second lateral surface 2d positioned on the outside with respect to the first lateral surface 2c, the area with which the whole of light emitted from the light-emitting element 1 can be received can be ensured on the side of the lower surface 2b. Additionally, on the first upper surface 2a, that is, the side of the light extraction surface of the first light transmissive member 2, the received light can be emitted from a plane area equal to or less than the area of the light-emitting element 1. As a result, the improvement of luminance can be achieved.

The materials constituting the first light transmissive member 2 include, for example, resin, glass, and inorganic substances (e.g., ceramic). Also, light diffusion materials or phosphors that can convert the wavelength of at least part of incident light may be included in the aforementioned materials. Specifically, materials cut out of a phosphor ingot such as single crystal phosphors, polycrystalline phosphors, and a sintered body made of phosphorous powder, or materials in which the phosphorous powder is mixed with resin, glass, or inorganic substances and is sintered may be employed. As the transparency increases, it is easy to reflect the light on an interface with the light reflective member described later, which makes it possible to improve luminance. The phosphor or the light diffusion material may be contained in the interior of the first light transmissive member 2, or layers containing the phosphor or the light diffusion material may be provided on both surfaces or one surface of the first light transmissive member 2. A method for forming the layers containing the phosphor or the light diffusion materials is not particularly limited, and for example, a spray method, an electrodeposition method, and an electrostatic coating method can be employed. Alternatively, phosphorous sheets made of materials in which the phosphor is diffused in the resin may be adhered.

For the phosphor contained in the first light transmissive member 2, materials that can be excited by the light emitted from the light-emitting element 1 can be employed. For example, the phosphors that can be excited by a blue light-emitting element or an ultraviolet light-emitting element include: yttrium aluminum garnet based phosphor activated by cerium (Ce: YAG); lutetium aluminum garnet based phosphor activated by cerium (Ce: LAG); nitrogen-containing calcium aluminosilicate based phosphor (CaO—$Al_2O_3$—$SiO_2$) activated by europium and/or chromium; silicate based phosphor (($Sr$, $Ba$)$_2SiO_4$) activated by europium; nitride based phosphor such as β sialon phosphor, CASN based phosphor, and SCASN based phosphor; KSF based phosphor ($K_2SiF_6$: Mn); sulfide based phosphor; and quantum dot phosphor. By combining the phosphor materials and a blue-color light emitting element or an ultraviolet light emitting element, many colors and color temperatures can be realized. For example, in certain embodiments of the present invention, light emitting devices can be manufactured to emit light of various colors, including, for instance, white-color-based light. In the case of the light-emitting device that can emit white light, the light emission is adjusted based on type or density of phosphor included in the first light transmissive member so as to emit white light. In the case where the aforementioned phosphors are contained in the first light transmissive member 2, it is preferable that the density of the phosphors be set, for example, to approximately 5 to 50 wt %. For the light diffusion member that can be contained in the first light transmissive member 2, for example, titanium oxide, barium titanate, aluminum oxide, and silicon oxide can be employed.

The first light transmissive member 2 is joined to cover the light extraction surface of the light-emitting element 1. The joining can be performed, for example, by direct joining by use of pressure bonding, sintering, surface activation joining, atomic diffusion joining, or hydroxyl group joining, joining by use of known adhesive members such as epoxy and silicone, adhering by use of organic adhesive members having high refractive index, and adhering by use of low-melting glass. In the case where the adhesive material is used for joining the light-emitting element 1 with the first light transmissive member 2, materials having high light transmissivity such as silicone resin can be employed for the adhesive material, thereby efficiently guiding the light from the light-emitting element 1 to the first light transmissive member 2. In this case, it is preferable that the light reflective member 6 described later cover the outer periphery of the adhesive material. In the case where the adhesive material is arranged over the lateral surface of the light-emitting element 1, it is preferable that the light reflective member 6 cover the lateral surface of the light-emitting element 1 via the adhesive material. Accordingly, the guided light from the light-emitting element 1 can be efficiently reflected by the light reflective member 6.

In the case where the first light transmissive member 2 is diced and segmented, the included angle and cutting width of a dicing blade are appropriately selected and changed, so that the first lateral surface 2c and the second lateral surface 2d of the first light transmissive member 2 can be formed in the aforementioned shape. Also, as a dicing method, the first lateral surface 2c and the second lateral surface 2d can be formed by half dicing.

(Second Light Transmissive Member 3)

Figure 3:
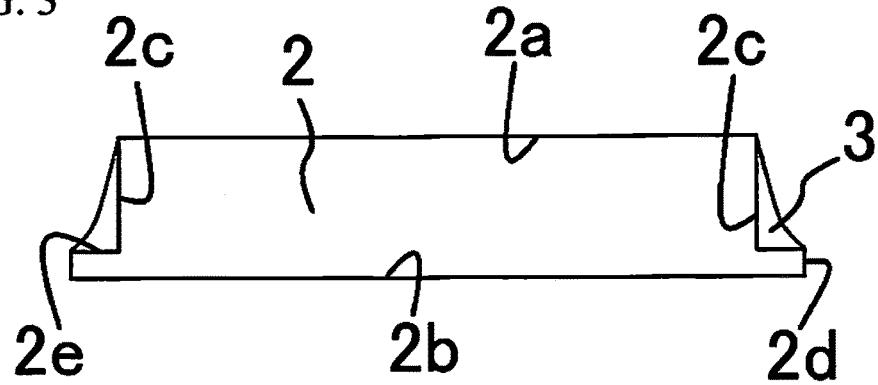
FIG. 3 is a schematic cross-sectional view illustrating the first light transmissive member and a second light transmissive member used for the light-emitting device of the embodiment of the present invention.

As illustrated in FIG. 3, the second light transmissive member 3 covers at least part of the first lateral surface 2c of the first light transmissive member 2. The second light transmissive member 3 may cover the entire first lateral surface 2c, but a partial area of the first lateral surface 2c on the first upper surface 2a side may be exposed from the second light transmissive member 3. In this case, it is preferable that the maximum length (i.e., the maximum length from the end portion on the side of the first upper surface 2a to the upper end of the second light transmissive member on the first lateral surface 2c) of the area of the first lateral surface 2c, which is exposed from the second light transmissive member 3, be equal to or less than approximately one third, one fourth, or one fifth of a height of the first light transmissive member 2 (i.e., a distance from the first upper surface 2a to the lower surface 2b). In the case where the second light transmissive member 3 covers the end edge on the side of the first upper surface 2a on the first lateral surface 2c, the width of the second light transmissive member 3 that covers the aforementioned partial area in a cross-sectional view is preferably reduced. Specifically, the width of the second light transmissive member 3 that covers the aforementioned partial area in a cross-sectional view is 10 μm or less. Accordingly, this can keep the light emitted from the second light transmissive member to the outside, to the minimum, so that the light-emitting device, in which a difference in luminance between the light-emitting portion (i.e., the first upper surface 2a of the first light transmissive member 2) and the non-light-emitting portion (i.e., on the light reflective member 6 in the periphery of the first upper surface 2a) is clear, and non-uniformity of light emission color is reduced, can be achieved.

It is preferable that the second light transmissive member 3 cover at least part of the second upper surface 2e of the first light transmissive member 2, and more preferably cover the entire second upper surface 2e. It is preferable that the second light transmissive member 3 does not cover the second lateral surface 2d.

The shape of the second light transmissive member 3 can be formed in a film shape, a quadrangular pyramid in which the second upper surface 2e serves as the bottom surface, or these deformed shapes. That is, it is preferable that the width of the second light transmissive member 3 in a cross-sectional view be different depending on the positions in the height direction. In particular, the second light transmissive member 3 on the side of the light reflective member 6 described later, in other words, the outer surface facing both the first lateral surface 2c and the second upper surface 2e is preferably a curved surface. The curved surface is preferably in contact with both the first lateral surface 2c and the second upper surface 2e. The curved surface is preferably concavely curved to the light reflective member 6 side. With the aforementioned shape, the light emitted from the light-emitting element 1 is combined with the light reflective member 6 described later on the outer surface of the second light transmissive member 3, and an appropriate reflection surface is formed, which allows the reflected light to advance to the light emission surface (the first upper surface 2a) side in the light-emitting device. As a result, the efficiency of light extraction on the first upper surface 2a can be improved, thereby achieving further high luminance and high luminous flux.

It is preferable that the second light transmissive member 3 continuously cover the lateral surface of the outer periphery of the first light transmissive member 2. In other words, it is preferable that the second light transmissive member 3 continuously cover the first lateral surface 2c and the second upper surface 2e of the first light transmissive member 2 along the periphery of the first light transmissive member 2. Accordingly, the reflection of the light from the aforementioned light-emitting element 1 can be ensured on the periphery of the light-emitting element 1, and high luminance and high luminous flux can be securely obtained.

The second light transmissive member 3 can be formed of the same material as the material constituting the first light transmissive member 2. In particular, resin is preferable due to the ease of handling and processing. Also, in the case where the first light transmissive member 2 contains the phosphor, it is preferable that the second light transmissive member 3 also contain the phosphor. In particular, it is preferable that the second light transmissive member 3 be formed of resin containing the phosphor. A height H from the lower surface 2b to the second upper surface 2e of the first light transmissive member 2 is lower than the height (thickness) of the whole of the first light transmissive member 2, and it is considered that much of the light emitted from the light-emitting element 1 is output from the second upper surface 2e of the first light transmissive member 2 without having been subjected to wavelength-conversion, and enters the second light transmissive member 3. However, the second light transmissive member 3 contains the phosphor, so that the unconverted light entered the second light transmissive member 3 is efficiently wavelength-converted with the phosphor in the second light transmissive member 3, thereby achieving the light-emitting device in which non-uniformity of light emission color is unlikely to occur.

After the aforementioned first light transmissive member 2 is prepared, the second light transmissive member 3 can be formed on the periphery of the first light transmissive member 2 (i.e., the first lateral surface 2c and the second upper surface 2e) by known methods such as printing, injection, a molding method, and potting. Among them, it is preferable that the second light transmissive member 3 be formed by the potting. With the aforementioned methods, the second light transmissive member 3 can be formed in a stable shape. The first light transmissive member 2 having the second upper surface 2e and the second lateral surface 2d can be manufactured by the two-phase cutting with a blade or other methods. In contrast, the edge of the blade is most likely to be worn away, so that the size of a portion in contact with the second upper surface 2e and the first lateral surface 2c, which are formed by the edge portion of the blade used for cutting from the upper surface side, tend to be varied and constant. However, in the case where the second light transmissive member 3 is formed by the potting of resin, the shape of the second light transmissive member 3 is determined based on the type and viscosity of the resin used for the second light transmissive member 3, so that even in the case where variation in the shape of the portion in contact with the second upper surface 2e and the first lateral surface 2c occurs, the shape of the periphery of the second light transmissive member 3 can be identical.

As for materials constituting the second light transmissive member 3, for example, in the case where the phosphor is contained in the resin, the phosphor tends to be located in a lower part of the second light transmissive member 3 due to what is called sedimentation. In other words, concentration of the phosphor become higher on the second upper surface 2e side of the second light transmissive member 3. Accordingly, the phosphor can be disposed at high concentration in a section on which the light is irradiated most in the second light transmissive member 3, so that multiple scattering is less likely to occur, and the wavelength can be effectively converted.

(Light-Emitting Element)

Light-emitting diodes are usually used for the light-emitting element 1. The composition, emission color light, wavelength, magnitude, and the number of light-emitting elements can be appropriately selected in accordance with purposes. For example, as for the blue or green light-emitting element, materials in which semiconductor layers such as ZnSe, nitride based semiconductors ($In_XAl_YGa_{1-X-Y}N$, $0 \leq X$, $0 \leq Y$, $X+Y \leq 1$), and GaP are included, can be used, and as for the red light-emitting element, materials in which semiconductor layers such as GaAlAs and AlInGaP are included, can be used.

The light-emitting element is usually a semiconductor stacked body formed by stacking semiconductor layers on a light transmissive growth substrate (e.g., sapphire substrate). The substrate is positioned at the upper surface side of the light-emitting element, and serves as a light extraction surface. The substrate may include depressions and projections on a surface joined with the semiconductor layer. Accordingly, a critical angle at which the light emitted from the semiconductor layer is incident on the substrate is intentionally changed, thereby easily extracting the light to the outside of the substrate. As for the light-emitting element, the growth substrate may be removed after the semiconductor layers are stacked. The removal can be performed, for example, by polishing or Laser Lift Off (LLO). After the removal of the growth substrate, the semiconductor layer nearest to the substrate is disposed on the upper surface side and serves as the light extraction surface.

The light-emitting element has structure in which a pair of positive and negative electrodes are provided on one surface of the semiconductor stacked body, so that the light-emitting element can be flip-chip mounted on a mounting board. In this case, on the semiconductor stacked body, a surface opposite to the surface on which the pair of electrodes are formed serves as the light extraction surface.

One or more light-emitting elements may be included in one light-emitting device. In other words, one or more light-emitting elements may be covered with one light transmissive member. In the case where the plurality of light-emitting elements are covered with one light transmissive member, it is preferable that the plurality of light-emitting elements be arranged in a row or array in such a manner that the entire light-emitting elements are formed in a quadrangular shape in a plan view. Accordingly, this makes it easy to approximately correspond the first light transmissive member 1 to the outer edge shape of the group of the plurality of light-emitting elements, thereby reducing the non-uniformity of light emission color at the end portion of the light emission surface.

(Light Reflective Member)

As illustrated in FIGS. 1A and 1B, the light-emitting device 10 includes the light reflective member 6 that surrounds the light-emitting element 1, the first light transmissive member 2, and the second light transmissive member 3. Specifically, the light reflective member 6 is arranged in such a manner as to cover the second light transmissive member 3, the second lateral surface 2d of the first light transmissive member 2, and the lateral surface of the light-emitting element 1. However, it is preferable that the first upper surface 2a of the first light transmissive member 2 be not covered with the light reflective member 6, but be exposed from the light reflective member 6. In this case, it is preferable that the first upper surface 2a of the first light transmissive member 2 be flush with the upper surface of the light reflective member 6, or that the upper surface of the light reflective member 6 be lower than the first upper surface 2a of the first light transmissive member 2.

Generally, the light emitted from the upper surface of the first light transmissive member, which serves as the light emission surface, is expanded in the lateral direction. If the height of the upper surface of the light reflective member is higher than the height of the upper surface of the first light transmissive member, the light emitted from the upper surface of the first light transmissive member is incident on the light reflective member and reflected, which causes the uneven light emission. Accordingly, the lateral surfaces of the first light transmissive member and the second light transmissive member are covered with the light reflective member, and the height of the light reflective member that covers the periphery of the lateral surfaces of the first light transmissive member and the second light transmissive member is lowered, thereby directly extracting the emitted light to the outside.

Also, in the case where the light-emitting element 1 is arranged on the board such as mounting board, it is preferable that the light reflective member 6 be also arranged between the light-emitting element 1 and the mounting board. Furthermore, in the case where the plurality of light-emitting elements are arranged, it is preferable that the light reflective member 6 be arranged between the each of light-emitting elements. The purpose for the above is to reduce of traveling the light emitted from one of the light-emitting element to the adjacent light-emitting element, resulting in improvement of the light extraction efficiency.

The light reflective member 6 is formed of a material that can reflect the light emitted from the light-emitting element 1. Accordingly, the light reflective member 6 reflects the light emitted from the light-emitting element 1 on interfaces between the second light transmissive member 3, the second lateral surface 2d of the first light transmissive member 2, and the lateral surface of the light-emitting element 1 into the second light transmissive member 3, the first light transmissive member 2, and the light-emitting element 1. As a result, the light travels in the second light transmissive member 3, the first light transmissive member 2, and the light-emitting element 1, and is finally output from the first upper surface 2a of the first light transmissive member 2 to the outside.

The light reflective member 6 can be formed by adding a substance having light reflectivity to a base material made of resin or hybrid resin, which is exemplified by resin of one type or more, such as silicone resin, modified silicone resin, epoxy resin, modified epoxy resin, and acrylic resin. As examples of the substance having light reflectivity, titanium oxide, silicon oxide, zirconium oxide, potassium titanate, alumina, aluminum nitride, boron nitride, and mullite are included. It is preferable that the reflectance of the light reflective member 6 be 60 percent or higher with respect to the light from the light-emitting element 1, more preferably, 80 or 90 percent or higher.

In addition to the light reflectivity, materials having heat dissipation may be employed for the light reflective member 6. As the aforementioned materials, aluminum nitride and boron nitride that have high thermal conductivity can be included. It is preferable that the thermal conductivity of the light reflective member 6 be 1 W/m·K or more. More preferably, the thermal conductivity of the light reflective member 6 is 3 W/m·K or more. Thus, by using a material having high thermal conductivity, a contact area between the light reflective member 6 and the second light transmissive member 3 can be increased, combined with the shape of the lateral surface of the first light transmissive member 2 and the second light transmissive member 3 described above. As a result, heat accumulated in the first light transmissive member 2 and the second light transmissive member 3 is easily transferred to the light reflective member 6, and the heat dissipation of the first light transmissive member 2 and the second light transmissive member 3 can be improved. There is a case where the phosphor contained in the first light transmissive member 2 or the second light transmissive member 3 generate self-heating that is attributed to Stokes loss, and the efficiency of light conversion is reduced due to the heat. However, as described above, by using a material having high thermal conductivity for the light reflective member 6, the heat of phosphor contained in the first light transmissive member 2 or the second light transmissive member 3 can be efficiently dissipated.

The amount of reflection and the amount of transmissivity of light can be varied based on the content of the substance having light reflectivity and/or the thickness of the light reflective member. Accordingly, the amount of reflection and the amount of transmissivity of light can be appropriately adjusted based on the characteristics of the light-emitting device to be obtained. For example, it is preferable that 20 to 60 pts. wt. of the substance having light reflectivity be included with respect to 100 pts. wt. of resin as a base material, more preferably, 25 to 35 pts. wt. of the substance having light reflectivity be included. Also, it is preferable that the thickness of the light reflective member be 150 μm or more so as to securely reduce the leakage of light from the light reflective member.

The light reflective member 6 can be molded, for example, by injection molding, potting, resin printing, transfer molding, and compression molding.

Disposing the light reflective member 6 can reduce the light leakage to the periphery of the light-emitting portion on the side (i.e., side opposite to the light-emitting element) of the light extraction surface of the first light transmissive member, so that the light-emitting device with good distinguishability can be provided. Herein, good distinguishability means that a boundary between the light-emitting portion and the non-light-emitting portion is clear. The clearer a difference in luminance between the light-emitting portion and the non-light-emitting portion becomes, the better the distinguishability is enhanced.

The light-emitting device 10 may include protective elements such as Zener diodes. The protective element is embedded in the light reflective member 6, thereby preventing the reduction of light extraction, which is attributed to absorption or blockage of light from the light-emitting element 1 by the protective element.

(Mounting Board)

As illustrated in FIGS. 1A and 1B, in the light-emitting device 10, the light-emitting element 1 is usually disposed on a mounting board 4. Materials for the mounting board 4 include members having insulation properties such as glass epoxy, resin, and ceramics, and metal members formed of insulating members. Among them, it is preferable to utilize ceramics for the materials of the mounting board due to having high heat resistance and weather resistance be utilized. Examples of the materials of ceramics may be alumina, aluminum nitride, and mullite. The materials having insulation properties, for example, BT resin, glass epoxy, and epoxy based resin may be combined with the materials of ceramics. The surface of the mounting board 4 usually includes wiring 5 to be connected to the light-emitting element 1. The materials of the wiring 5 are not particularly limited, but can be formed, for example, of metal such as copper, aluminum, gold, silver, platinum, titanium, tungsten, palladium, iron, and nickel, or an alloy including any of the aforementioned metal. Also, it is preferable that the uppermost surface of the wiring formed on the upper surface of the mounting board be covered with materials having high reflectivity such as silver or gold so as to efficiently extract the light from the light-emitting element 1. The wiring can be formed by electroplating, electroless plating, vacuum evaporation, and sputtering. For example, in the case where Au bumps are used for mounting the light-emitting element on the mounting board, using Au for the uppermost surface of the wiring can improve the joinability between the light-emitting element and the mounting board. The aforementioned mounting board is known in the field of technologies, and any of mounting boards used for mounting the light-emitting element can be employed.

Example 1

The second light transmissive member 3 illustrated in FIG. 3 is formed using the first light transmissive member 2 illustrated in FIGS. 2A and 2B, and the light-emitting device 10 illustrated in FIGS. 1A and 1B is produced using the second light transmissive member 3, and the distribution of luminance has been measured.

In the light-emitting device 10, five light-emitting elements 1 (size: 1.3 mm×1.3 mm) are disposed in series on the mounting board 4. As for the mounting board 4, titanium, palladium, and gold are evaporated in the form of patterns in aforementioned order on the surface of a plate material made of aluminum nitride, whose thermal conductivity is approximately 170 W/m·K, and gold plating is applied thereon. The light-emitting elements 1 are flip-chip mounted by bumps made of gold.

The upper surfaces of the light-emitting elements 1 are covered with the plate-like first light transmissive member 2 which includes 5 to 10 wt % of YAG phosphor, has dimensions of 1.55 mm×5.9 mm×0.20 mm (height), and is made of glass in which YAG is dispersed. The light-emitting elements 1 and the first light transmissive member 2 are joined with an adhesive material having light-guide properties and made of the silicone resin. In the first light transmissive member 2, the distance L is set to 0.125 mm, and the height H is set to 0.05 mm. The second light transmissive member 3 is formed of the silicone resin containing 20 wt % of the YAG phosphor and formed in such a manner that the first lateral surface 2c and the second upper surface 2e of the first light transmissive member 2 are completely covered by potting. The lateral surfaces of the light-emitting elements 1, the first light transmissive member 2, and the second light transmissive member 3 are surrounded with the light reflective member 6 by the potting. The light reflective member 6 contains 30 pts. wt. of titanium oxide with respect to 100 pts. wt. of silicone resin, and the thermal conductivity thereof is approximately 1 W/m·K. The light reflective member 6 is approximately flush with the first upper surface 2a of the first light transmissive member 2. The width(s) of the light reflective member 6 are preferably approximately 1.2 mm as measured from an outer edge of the light reflective member 6 to lateral surfaces of the first light transmissive member 2, the second light transmissive member 3, and the light-emitting elements 1.

The light-emitting device 10 described above can be provided as a light-emitting device in which a difference in luminance between the light-emitting portion and the non-light-emitting portion is clearer, and front luminance is higher.

INDUSTRIAL APPLICABILITY

The light-emitting device of the present disclosure can be applied to various light sources such as light sources for lighting, light sources for various indicators, light sources for displays, light sources for the backlight of a liquid crystal display, traffic lights, components installed in or on vehicles, and channel letters for signboards, in addition to light sources of exterior and interior illumination of motor vehicles.

What is claimed is:

1. A light-emitting device comprising:
a light-emitting element;
a first light transmissive member disposed over the light-emitting element and including a first upper surface, a lower surface, a first lateral surface, a second lateral surface positioned outside the first lateral surface, and a second upper surface between the first lateral surface and the second lateral surface;
a second light transmissive member covering at least a part of the first lateral surface and the second upper surface of the first light transmissive member without an outermost lateral or surface of the second light transmissive member protruding outwardly over an outer edge of the second upper surface of the first light transmissive member; and
a light reflective member disposed on a lateral surface of the second light transmissive member, the second lateral surface of the first light transmissive member, and a lateral surface of the light-emitting element.

2. The light-emitting device according to claim 1, wherein the first upper surface and the second upper surface are parallel to each other.

3. The light-emitting device according to claim 1, wherein the first lateral surface is in contact with the first upper surface.

4. The light-emitting device according to claim 3, wherein the first lateral surface is perpendicular to the first upper surface.

5. The light-emitting device according to claim 1, wherein the second lateral surface is in contact with the lower surface.

6. The light-emitting device according to claim 5, the second lateral surface is perpendicular to the lower surface.

7. The light-emitting device according to claim 1, wherein a partial area of the first lateral surface on a side where the first lateral surface is in contact with the first upper surface is exposed from the second light transmissive member.

8. The light-emitting device according to claim 1, wherein the outermost lateral surface of the second light transmissive member includes a curved surface on a light reflective member side.

9. The light-emitting device according to claim 8, wherein the curved surface is curved and in contact with the first lateral surface and the second upper surface.

10. The light-emitting device according to claim 8, wherein the curved surface is concavely curved to a light reflective member side.

11. The light-emitting device according to claim 1, wherein the second light transmissive member successively covers a peripheral lateral surface of the first light transmissive member.

12. The light-emitting device according to claim 1, wherein the first light transmissive member contains a phosphor.

13. The light-emitting device according to claim 1, wherein the second light transmissive member is formed of resin.

14. The light-emitting device according to claim 1, wherein the second light transmissive member is formed of resin which contains a phosphor.

15. The light-emitting device according to claim 14, wherein the phosphor is located in a lower part of the second light transmissive member.

16. The light-emitting device according to claim 1, wherein an edge of the first upper surface of the first light transmissive member corresponds to an outer edge of a part of the light-emitting element in a plan view.

17. The light-emitting device according to claim 1, wherein an entire upper surface of the light-emitting element is covered with the lower surface of the first light transmissive member.

18. The light-emitting device according to claim 1, wherein a plurality of light-emitting elements are covered with the first light transmissive member.

19. The light-emitting device according to claim 18, wherein an edge of the first upper surface of the first light transmissive member is positioned on an inner side to an outer edge of a group of the plurality of light-emitting elements in a plan view.

20. The light-emitting device according to claim 1, wherein the first light transmissive member and the light-emitting element are adhered with an adhesive material.

21. The light-emitting device according to claim 20, wherein the light reflective member covers a periphery of the adhesive material.

* * * * *

UNITED STATES PATENT AND TRADEMARK OFFICE
CERTIFICATE OF CORRECTION

PATENT NO. : 9,722,156 B2
APPLICATION NO. : 15/239914
DATED : August 1, 2017
INVENTOR(S) : Satoshi Shichijo et al.

It is certified that error appears in the above-identified patent and that said Letters Patent is hereby corrected as shown below:

On the Title Page

Item [72] reads:
[72] Inventors: Satoshi Shichijo, Tokushima (JP); Kunihito Sugimoto, Anan (JP); Kenji Ozeki, Tokushima (JP)
Should read:
-- [72] Inventors: Satoshi Shichijo, Itano-gun (JP); Kunihito Sugimoto, Anan (JP); Kenji Ozeki, Tokushima (JP) --

Signed and Sealed this
Thirteenth Day of March, 2018

Andrei Iancu
*Director of the United States Patent and Trademark Office*